United States Patent
Fu et al.

(10) Patent No.: US 8,587,084 B2
(45) Date of Patent: Nov. 19, 2013

(54) SEAMLESS MULTI-POLY STRUCTURE AND METHODS OF MAKING SAME

(75) Inventors: Shih-Chi Fu, Zhudong Township (TW);
Ching-Sen Kuo, Taipei (TW);
Wen-Chen Lu, Kaohsiung (TW);
Chih-Yuan Chen, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 37 days.

(21) Appl. No.: 13/342,148

(22) Filed: Jan. 2, 2012

(65) Prior Publication Data
US 2013/0168794 A1 Jul. 4, 2013

(51) Int. Cl.
*H01L 21/70* (2006.01)
*H01L 21/76* (2006.01)

(52) U.S. Cl.
USPC .......................................... 257/499; 438/400

(58) Field of Classification Search
CPC ................... H01L 27/0207; H01L 2924/3011;
H01L 2924/14; H01L 21/76224; H01L 21/76229; H01L 21/2018
USPC .......... 257/443, 431, 499, 501; 438/400, 142, 438/66, 73, 128
See application file for complete search history.

(56) References Cited

U.S. PATENT DOCUMENTS

| 8,039,324 B2* | 10/2011 | Shim .............................. 438/141 |
| 2007/0254490 A1* | 11/2007 | Jain ............................... 438/736 |
| 2011/0248357 A1* | 10/2011 | Kwon et al. ................... 257/392 |

* cited by examiner

*Primary Examiner* — Nikolay Yushin
(74) *Attorney, Agent, or Firm* — Slater & Matsil, L.L.P.

(57) ABSTRACT

A sensor array is integrated onto the same chip as core logic. The sensor array uses a first polysilicon and the core logic uses a second polysilicon. The first polysilicon is etched to provide a tapered profile edge in the interface between the sensor array and the core logic regions to avoid an excessive step. Amorphous carbon can be deposited over the interface region without formation of voids, thus providing for improved manufacturing yield and reliability.

20 Claims, 4 Drawing Sheets

SEAMLESS MULTI-POLY STRUCTURE AND METHODS OF MAKING SAME

BACKGROUND

CMOS image sensor (CIS) products have met wide spread acceptance in a host of applications from cameras to smart phones. One advantageous feature of CIS products is that the devices can be manufactured inexpensively and to small scales by integrating the manufacturing steps for the CIS with mature CMOS manufacturing processes. A sensor array, core logic, and input/output (I/O) devices can be manufactured as a single integrated circuit using well known CMOS processes. The integration of sensor arrays and core logic devices in a single integrated circuit can nonetheless give rise to manufacturing obstacles that can impact yield, cost, and reliability. Hence, improved manufacturing processes and resulting structures are needed.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

Figure 1A:
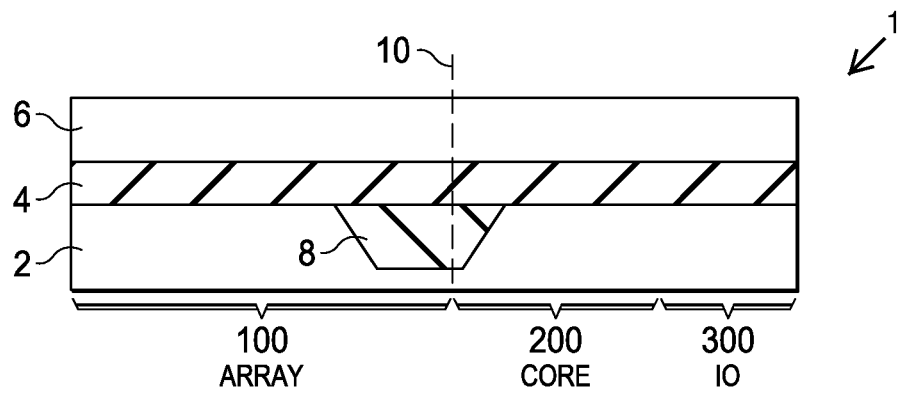
FIGS. 1a through 1i schematically illustrate, in cross-sectional view, intermediate stages in the manufacture of an integrated circuit using a first embodiment.

FIG. 1a illustrates an intermediate step in the manufacture of an illustrative integrated circuit 1 including a sensory array region 100, a core logic region 200 and an I/O region 300. One skilled in the art will recognize that the figures herein are highly schematic in nature and omit many features and details of an integrated circuit that are not necessary for understanding the disclosed embodiments. An area of particular interest, however, of integrated circuit 1 is the interface between array region 100 and core region 200, as schematically illustrated by dotted line 10 in FIG. 1a. This region is of particular interest because the use of two different polysilicon layers (illustrated in subsequent figures) in the manufacture of integrated circuit 1 can result in defects arising in this interface region.

Integrated circuit 1 includes a substrate 2 including an isolation region 8. In the illustration, isolation region 8 is a shallow trench isolation region; other isolation regions are within the contemplated scope of this disclosure. First gate oxide 4 is formed above substrate 2 and first polysilicon 6 is formed above first gate oxide 4. One skilled in the art will recognize the various materials and formation processes that could be employed to form the structure illustrated in FIG. 1a, and they are hence not repeated herein. A photoresist layer 12 (not shown in FIG. 1a, but shown after patterning in FIG. 1b) is formed over the structure and patterned using known photolithography techniques. Photoresist 12 is used to pattern first polysilicon 6 and first gate oxide 4 as described in more detail below.

Figure 1B:
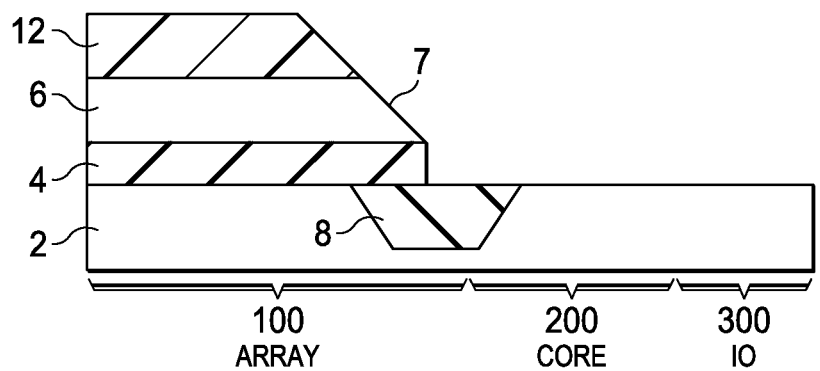

As illustrated in FIG. 1b, the device is subjected to an etch process whereby unmasked regions of first polysilicon 6 and first gate oxide 4 are removed. An advantageous feature of the presently disclosed embodiment is a tapered profile for the resulting edge 7 of first polysilicon 6. The advantages flowing from this tapered profile will be described in more detail below. The illustrated tapered profile can be accomplished in numerous different ways. In one embodiment, the device is etched, using a low selective etch process, as follows to achieve the desired edge profile.

In one embodiment, first polysilicon 6 is etched using a dry etch process. As an example, first polysilicon 6 could be etched in a plasma etch chamber such as a Kiyo etcher available from Lam Research Corp., Fremont, Calif. An illustrative dry etch process could employ, for instance, a mixture of 180HBr/210He/3O$_2$ SCCM for about 120 seconds at a pressure of about 40 mT. An electrode voltage of about 175V and a power of about 300 W could be employed during the etch process.

In another embodiment, first polysilicon is wet etched using, e.g., a composition of HNA (HF+HNO$_3$+CH$_3$COOH mixed acid). One skilled in the art will recognize that various other wet and/or dry etch processes can be employed to obtain the desired tapered profile, informed by the present teaching and using routine experimentation.

In illustrative embodiments, edge 7 has an angle of from about 30 degrees to about 75 degrees, relative the major surface of substrate 2. In a most illustrative embodiment, edge 7 may have an angle of about 45 degrees relative the major surface of substrate 2.

This step of patterning first polysilicon 6 is a gross pattern step wherein first polysilicon 6 is simply removed from core logic region 200 and I/O region 300 and left overlying sensor array region 100. Fine patterns, such as gate electrodes, are not formed during this gross pattern step. Such fine patterns are formed in a subsequent step, which will be described below.

Figure 1C:
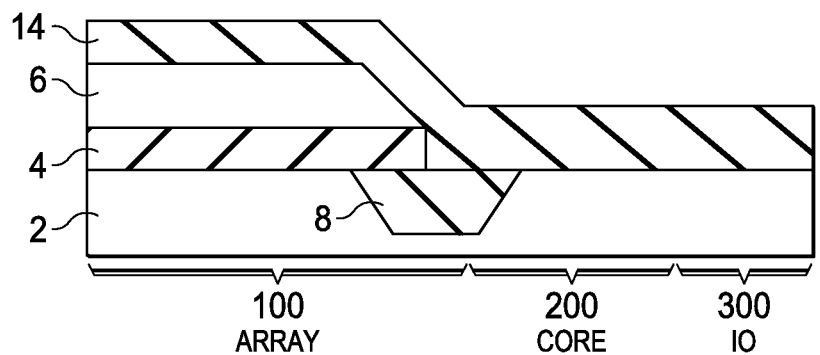
Figure 1D:
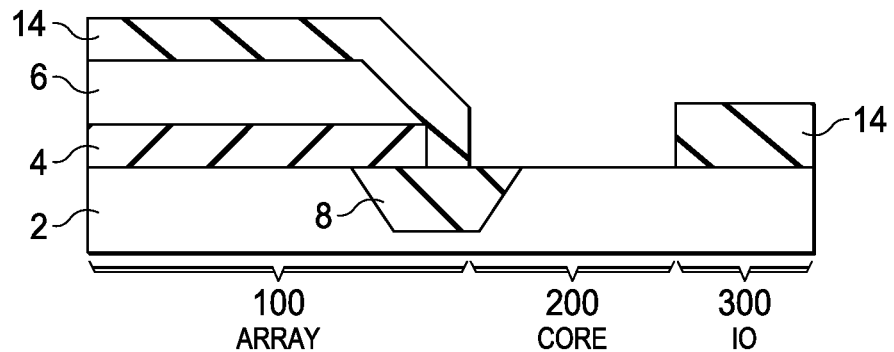

With reference now to FIG. 1c, a second gate oxide 14 is formed over the device, using known techniques such as thermal growth, CVD, PVD, and the like. As illustrated, second gate oxide 14 is grown or deposited to be conformal to the underlying layers (i.e., first polysilicon 6, isolation region 8, substrate 2, etc.). As will be described in more detail below, second gate oxide 14 will be used in the I/O region 300, such as to form I/O devices that need to operate under higher voltage conditions than is required for the core logic devices. Second oxide 14 is then removed from core logic region 200 by masking regions 100 and 200 (using, e.g. a patterned photoresist layer, not shown) and etching the remaining exposed portions of second gate oxide using known etch processes, such as a wet HF etch. The resulting structure is illustrated in FIG. 1d.

Figure 1E:
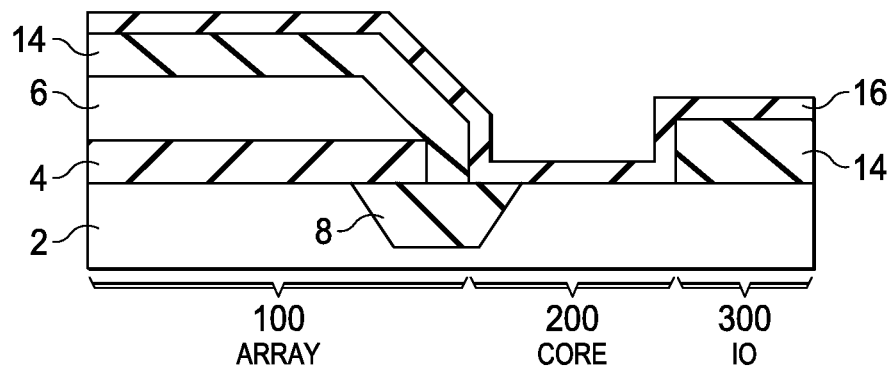

Continuing on with FIG. 1e, third gate oxide 16 is formed over the structure. This third gate oxide 16 is thinner than second gate oxide 14 in the illustrated embodiment and will form the gate dielectric for transistors formed core logic region 200, which require lower operating voltages than transistors formed in I/O region 300. In the illustrated embodiment, third gate oxide 16 is thinner than first gate oxide 4, which is used for forming sensors in sensor array region 100. This is because it is desirable to minimize leakage current for devices formed in sensor array region 100, and hence a thicker gate oxide (relative the gate oxide in the logic core region 200) is acceptable even at the cost of slightly lower switching speeds for those devices.

Figure 1F:
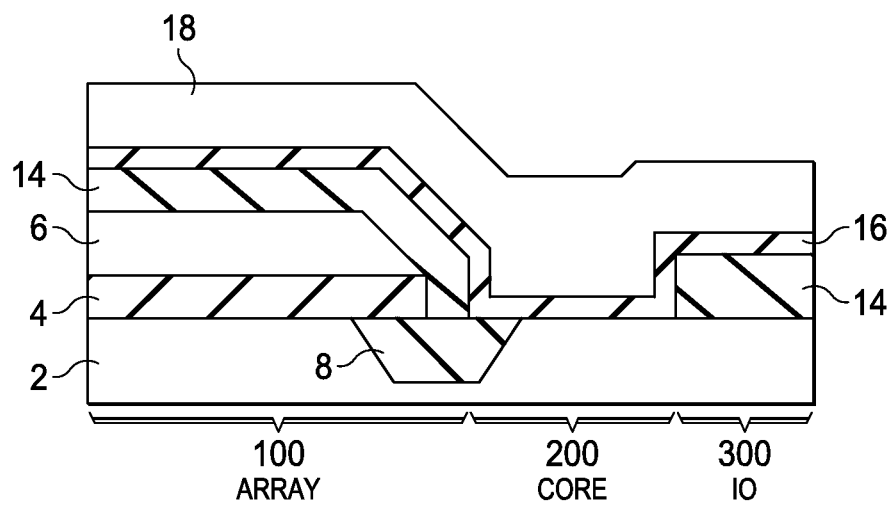

Second polysilicon 18 is next formed over the device using well known deposition techniques, as show in FIG. 1f. Second polysilicon will form, e.g., a gate electrode for devices such as transistors formed in core logic region 200 and I/O region 300. By contrast, first polysilicon 6 will form, e.g., a gate electrode for devices formed in sensor array region 100.

Figure 1G:
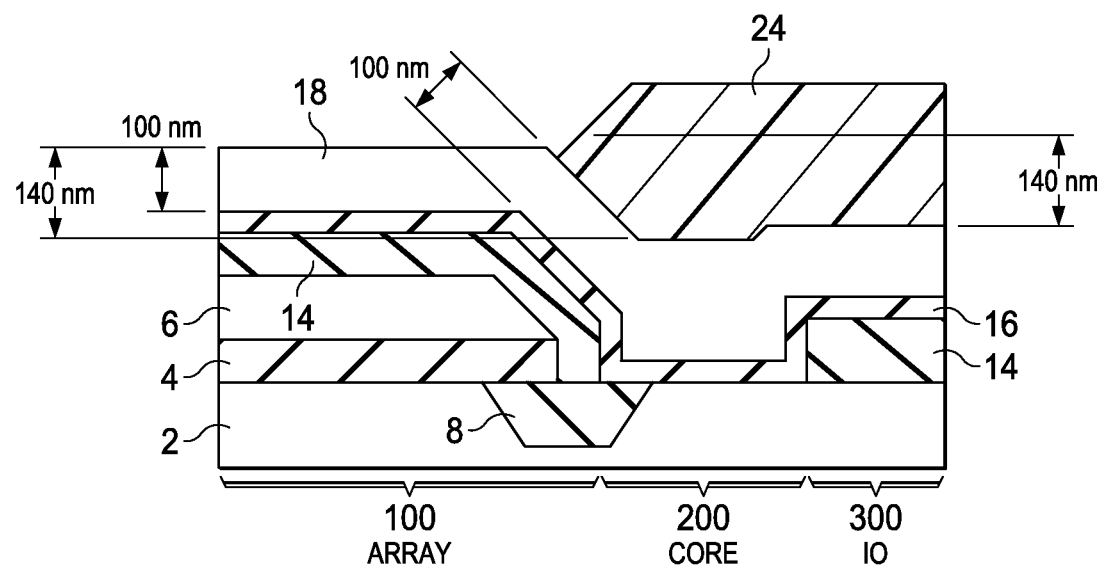

In a next step, illustrated in FIG. 1g, a photoresist material 24 is applied and patterned on the structure. Using patterned photoresist material 24, second polysilicon 18 is patterned to remove second polysilicon 18 from the sensor array region 100. Note that, again, a tapered profile is desirable and is obtained in the process of patterning photoresist material 24 and in patterning second polysilicon 18.

In one embodiment, this tapered profile is obtained as follows. First, photoresist material 24 is formed to have a tapered profile, such as the profile illustrated in FIG. 1g. In one embodiment, this tapered profile is obtained by a hard baking process, at a temperature above the Tg threshold of the photoresist material, to cause the material to reflow. For a typical photoresist material, a hard bake process of from about 140 C to about 180 C for from about 60 seconds to about 200 seconds should be sufficient to provide the tapered profile. In another embodiment, photoresist material 24 is applied to a thickness of greater than about 1000 nm. Next, during a hard bake process of from about 100 C to about 130 C, the evaporation of solvents from the photoresist material, along with the cohesive force of the material, will induce the desired tapered profile.

Next, second polysilicon 18 is etched in a manner to continue the tapered profile, using the tapered photoresist material 24 as a mask. In one embodiment, first polysilicon 6 is etched using a dry etch process. As an example, first polysilicon 6 could be etched in a plasma etch chamber such as a Kiyo etcher available from Lam Research Corp., Fremont, Calif. An illustrative dry etch process could employ, for instance, a mixture of 180HBr/210He/3$O_2$ SCCM at a pressure of about 40 mT. An electrode voltage of about 175V and a power of about 300 W could be employed during the etch process. In another embodiment, first polysilicon is wet etched using, e.g., a composition of HNA (HF+$HNO_3$+$CH_3COOH$ mixed acid). One skilled in the art will recognize that various other wet and/or dry etch processes can be employed to obtain the desired tapered profile, informed by the present teaching and using routine experimentation. While the same processes as described above for etching first polysilicon 6 have been described herein for etching second polysilicon 18, different processes could also be used when etching the second polysilicon layer relative the first polysilicon layer.

As one specific example, assume that second polysilicon 18 is formed to a nominal thickness of about 100 nm.

Figure 1H:
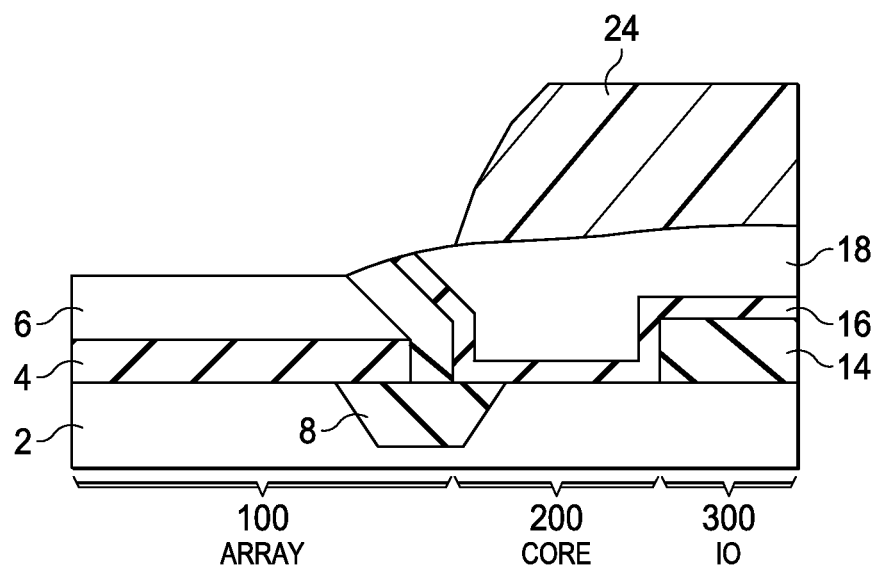

Note that it is preferable that photoresist material 24 have an etch rate ratio of about 2:1 relative second polysilicon 18. In this way, as illustrated in FIGS. 1g and 1h, photoresist material 24 etches back more quickly than does second polysilicon 18. Hence, second polysilicon 18 is removed completely or substantially completely from over first polysilicon 6 and interface region 10 (illustrated in FIG. 1a), while still protecting second polysilicon 18 in core region 200 and I/O region 300. This is best illustrated in FIG. 1h.

Figure 1I:
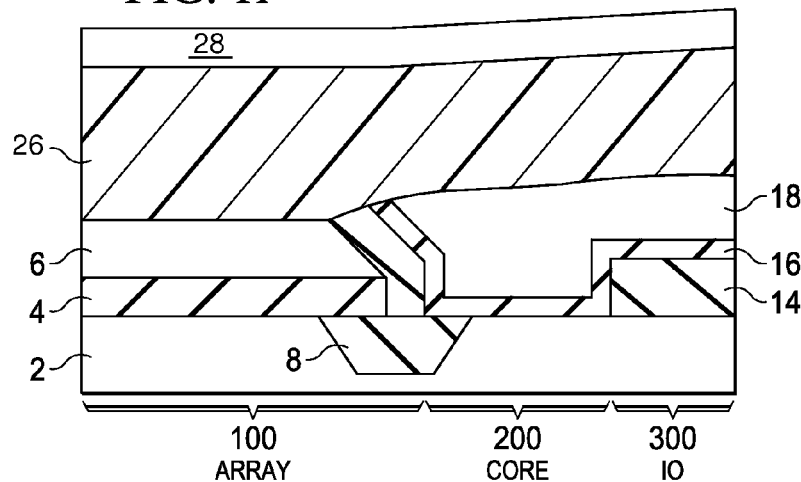

Processing continues with removal of photoresist material 24. Next, a thick layer of amorphous carbon (A-C) 26 and a thin overlying layer of SiON 28 are formed over the device, as illustrated in FIG. 1i. As those skilled in the art recognize, A-C 26 and SiON 28 operate as a hard mask for subsequent processes of patterning first polysilicon 6 and second polysilicon 18. Note that, contrary to convention methods and structures, A-C 26 and SiON 28 provide complete seamless coverage over the interface region between array region 100 and core region 200. This is due, at least in part, to the tapered profile of patterned first polysilicon 6, as described above.

Figure 2:
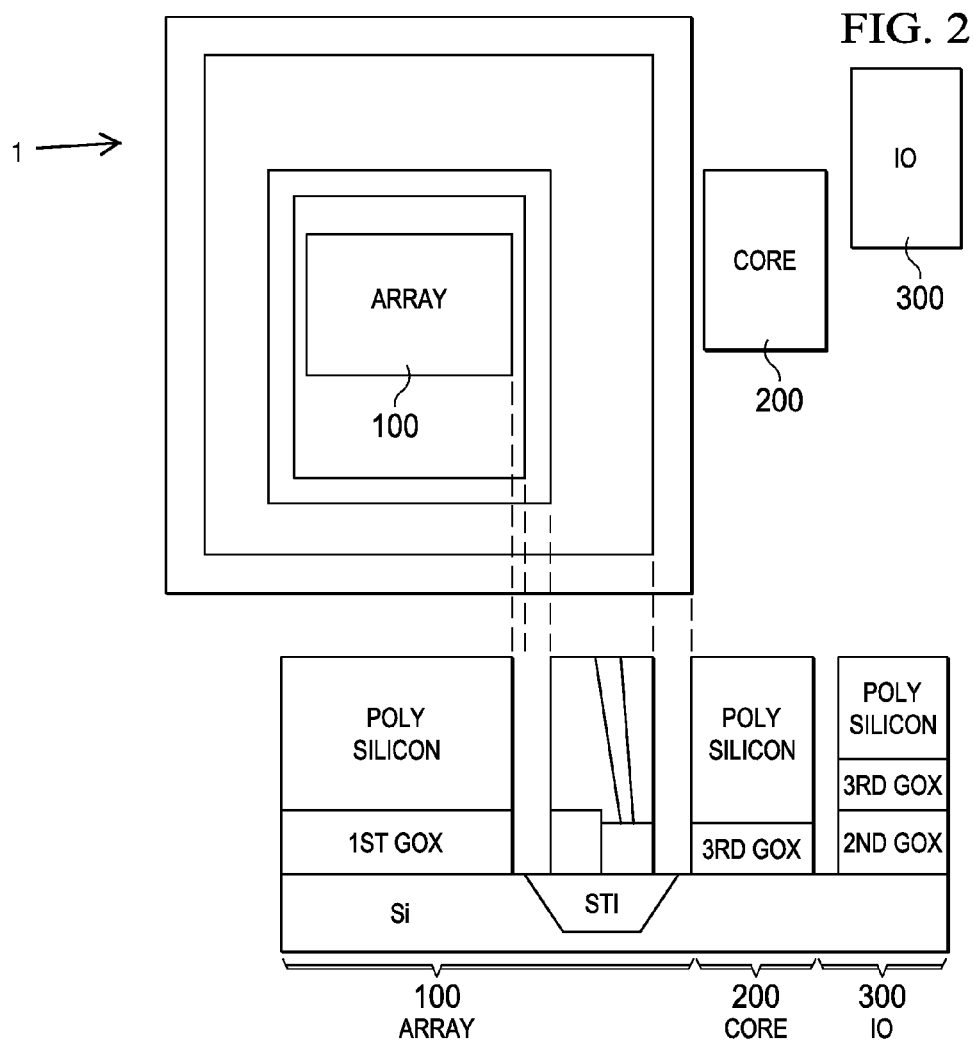
FIG. 2 schematically illustrates a first embodiment integrated circuit from a top down perspective.

FIG. 2 illustrates in both cross-sectional views and plan views array region 100, core region 200, and I/O region 300 and particularly the tapered profile of polysilicon 6 in the interface region between array region 100 and core region 200.

What is claimed is:

1. A method for forming an integrated circuit comprising:
   forming a first gate oxide on a substrate, the substrate including a sensor array region, a core logic region, and an input/output (I/O) region;
   depositing a first polysilicon over the first gate oxide;
   patterning the first polysilicon to have a tapered profile edge at an interface between the sensor array region, and the core logic region;
   forming a second gate oxide over the first polysilicon and the substrate;
   patterning the second gate oxide to remove the second gate oxide from the core region;
   forming a third gate oxide over the second gate oxide and over the substrate in the core region;
   depositing a second polysilicon over the third gate oxide and removing the second polysilicon over the sensor array region, wherein the second polysilicon is formed over the tapered profile edge of the first polysilicon, and removing the second gate oxide and the third gate oxide over the sensor array region;
   depositing an amorphous carbon layer over the second polysilicon, wherein the amorphous carbon layer is void free at the interface between the sensor array region and the core logic region; and
   patterning the amorphous carbon layer and patterning the first polysilicon and the second polysilicon using the patterned amorphous carbon layer as a hard mask.

2. The method of claim 1 wherein the step of removing the second polysilicon over the sensor array region comprises:
   depositing a photoresist material over the second polysilicon;
   patterning the photoresist material to have at least one edge;
   processing the at least one edge to have a tapered profile; and
   using the patterned photoresist material as a mask during an etch process performed on the second polysilicon.

3. The method of claim 2 wherein processing the at least one edge includes heating the photoresist material to a point above a phase transition temperature of the photoresist material.

4. The method of claim 2 wherein processing the at least one edge includes deposing the photoresist material to a thickness of more than about 1000 nm and baking the patterned photoresist material at a temperature of from about 100 C to about 130 C.

5. The method of claim 1 wherein the step of patterning the first polysilicon to have a tapered profile edge includes exposing the first polysilicon to an etch plasma derived from a precursor gas containing HBr.

6. The method of claim 5 wherein the etch plasma is derived from a precursor gas containing HBr, He, and $O_2$.

7. The method of claim 1 wherein the step of patterning the first polysilicon to have a tapered profile edge includes exposing the first polysilicon to a wet etch chemistry containing HF +$HNO_3$+$CH_3COOH$.

8. The method of claim 1 wherein the step of patterning the first polysilicon to have a tapered profile edge results in a tapered profile having an angle of from about 30 degrees to about 75 degrees.

9. The method of claim 8 wherein the angle is about 45 degrees.

10. A method of forming an image sensor comprising:
forming within a substrate an isolation region;
forming over the substrate a first gate oxide;
depositing a first polysilicon over the first gate oxide;
depositing a first photoresist over the first polysilicon;
patterning the first polysilicon, using the first photoresist, to form a first edge of the first polysilicon having a tapered profile;
forming at least one additional gate oxide over the patterned first polysilicon, wherein the at least one additional gate oxide is formed conformally over the tapered profile of the first edge of the first polysilicon;
forming a second polysilicon over the at least one additional gate oxide;
depositing a second photoresist over the second polysilicon;
patterning the second photoresist to form a first edge of the second photoresist having a tapered profile; and
patterning the second polysilicon, using the tapered profile edge of the second photoresist as a mask.

11. The method of claim 10 further comprising forming a hard mask over the patterned second polysilicon and the patterned first polysilicon, wherein the hard mask covers an interface between the first patterned polysilicon and the second patterned polysilicon seamlessly.

12. The method of claim 11 wherein forming a hard mask comprises depositing an amorphous carbon layer over the patterned second polysilicon and the patterned first polysilicon.

13. The method of claim 12 wherein forming a hard mask further comprises deposing a SiON layer on the amorphous carbon layer.

14. The method of claim 10 wherein patterning the first polysilicon, using the first photoresist and patterning the second photoresist, using the tapered profile edge of the second photoresist, are respective gross patterning steps, the method further comprising performing a fine patterning step on the patterned first polysilicon and the patterned second silicon.

15. The method of claim 10 wherein the step of patterning the second photoresist to form a first edge of the second photoresist having a tapered profile includes reflowing the second photoresist.

16. The method of claim 10 wherein the step of patterning the second photoresist to form a first edge of the second photoresist having a tapered profile includes depositing the second photoresist to a thickness of greater than about 1000 nm and baking the second photoresist at a temperature of from about 100 C to about 130 C.

17. An integrated circuit comprising:
a substrate;
an isolation region in the substrate;
an array region formed on the substrate, the array region having a first patterned polysilicon layer therein;
a core logic region formed on the substrate, adjacent the array region, the core logic region having a second patterned polysilicon layer therein; and
an interface region wherein the first patterned polysilicon layer is adjacent the second patterned polysilicon layer, the first patterned polysilicon layer having at least one edge in the interface region, the at least one edge having a tapered profile.

18. The integrated circuit of claim 17 wherein the tapered profile forms an angle of from about 30 degrees to about 75 degrees relative to a plane of a major surface of the substrate.

19. The integrated circuit of claim 17 further comprising an oxide formed on the tapered profile.

20. The integrated circuit of claim 17 wherein a portion of the second patterned polysilicon layer overlies a portion of the tapered profile.

* * * * *